United States Patent
Manger et al.

(10) Patent No.: US 6,861,688 B2
(45) Date of Patent: Mar. 1, 2005

(54) LINE CONFIGURATION FOR BIT LINES FOR CONTACT-CONNECTING AT LEAST ONE MEMORY CELL, SEMICONDUCTOR COMPONENT WITH A LINE CONFIGURATION AND METHOD FOR FABRICATING A LINE CONFIGURATION

(75) Inventors: Dirk Manger, Dresden (DE); Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 162 days.

(21) Appl. No.: 10/288,387

(22) Filed: Nov. 5, 2002

(65) Prior Publication Data

US 2003/0087519 A1 May 8, 2003

(30) Foreign Application Priority Data

Nov. 5, 2001 (DE) .......................................... 101 55 023

(51) Int. Cl.[7] ........................ H01L 27/108; H01L 29/76
(52) U.S. Cl. ...................... 257/296; 257/301; 257/306; 257/758
(58) Field of Search ................................ 257/295–308, 257/368, 401, 347, 758

(56) References Cited

U.S. PATENT DOCUMENTS

| | | | | |
|---|---|---|---|---|
| 5,170,243 A | * | 12/1992 | Dhong et al. ................ 365/208 |
| 5,292,678 A | * | 3/1994 | Dhong et al. ................ 438/622 |
| 5,792,703 A | * | 8/1998 | Bronner et al. ............. 438/620 |
| 5,793,068 A | * | 8/1998 | Mahant-Shetti ............. 257/204 |
| 5,929,492 A | * | 7/1999 | Okamura ..................... 257/365 |
| 6,180,453 B1 | * | 1/2001 | Sung et al. .................. 438/256 |
| 6,222,758 B1 | * | 4/2001 | Higashide .................... 365/154 |
| 6,266,268 B1 | * | 7/2001 | Noble .......................... 365/149 |
| 6,395,594 B2 | * | 5/2002 | Kotecki et al. ............. 438/238 |
| 6,429,474 B1 | * | 8/2002 | Gambino et al. ........... 257/296 |
| 6,465,331 B1 | * | 10/2002 | Keeth et al. ................. 438/479 |
| 6,544,832 B2 | * | 4/2003 | Kotecki et al. ............. 438/239 |
| 6,599,796 B2 | * | 7/2003 | Mei et al. .................... 438/243 |
| 6,649,501 B2 | * | 11/2003 | Lee et al. .................... 438/586 |
| 6,661,041 B2 | * | 12/2003 | Keeth .......................... 257/211 |
| 6,710,386 B2 | * | 3/2004 | Takashima ................... 257/295 |
| 6,735,107 B1 | * | 5/2004 | Takashima ................... 365/145 |
| 6,750,493 B2 | * | 6/2004 | Takashima ................... 257/295 |
| 6,759,280 B2 | * | 7/2004 | Lee .............................. 438/129 |
| 6,798,009 B2 | * | 9/2004 | Forbes et al. ............... 257/301 |

FOREIGN PATENT DOCUMENTS

DE 44 30 483 A1 6/1995

OTHER PUBLICATIONS

Heinz Hoenigschmid et al.: "A 7F² Cell and Bitline Architecture Featuring Tilted Array Devices and Penalty–Free Vertical BL Twists for 4–Gb DRAM's", *IEEE Journal of Solid–State Circuits*, vol. 35, No. 5, May 2000, pp. 713–718.

* cited by examiner

Primary Examiner—Michael S. Lebentritt
(74) Attorney, Agent, or Firm—Laurence A. Greenberg; Werner H. Stemer; Gregory L. Mayback (57) ABSTRACT

A bit line configuration for contact-connecting at least one memory cell, in particular a DRAM memory cell, has bit lines disposed above the plane of the memory cell. A first bit line in a first bit line level is disposed below a second bit line in a second bit line level and the second bit line penetrates through the first bit line at at least one location of the first bit line for the purpose of producing a contact with the at least one memory cell at penetration locations. It is thus possible to provide space-saving structures, in particular sub-8F² structures.

9 Claims, 10 Drawing Sheets

LINE CONFIGURATION FOR BIT LINES FOR CONTACT-CONNECTING AT LEAST ONE MEMORY CELL, SEMICONDUCTOR COMPONENT WITH A LINE CONFIGURATION AND METHOD FOR FABRICATING A LINE CONFIGURATION

BACKGROUND OF THE INVENTION

Field of the Invention

The invention relates to a line configuration for bit lines for contact-connecting at least one memory cell in a substrate, in particular for a DRAM memory cell. The bit lines are disposed above the plane of the substrate. The invention further relates to a method for fabricating the bit line.

In principle, memory cells of semiconductor memory components are disposed in a matrix like configuration in columns and rows. In this case, the rows are connected by word lines and the columns by bit lines.

The increasing miniaturization of the structures in semiconductor memory components makes it necessary, in particular, to keep the areas occupied by bit lines as small as possible.

The approach of reducing the area of a memory cell by using a novel memory cell concept is attractive as a possible alternative to reducing the minimum line width. A reduction from $8F^2$ to $6F^2$ results in a 20% increase in the storage density. This corresponds to a customary miniaturization generation, without requiring capital expenditure on new lithography tools.

Applications using open bit line configurations, in which the minimum possible size is $4F^2$, have proved to be very complicated or have a very high noise level.

The publication by Hoenigschmid et al., titled "A $7F^2$ Cell/Bitline Architecture Comprising 30° Tilted Array Devices and Penalty Free Inter BL Twists for 4 Gb DRAMs" (IEEE Journal of Solid-State Circuits, Vol. 35, No. 5, May 2000) proposes a "vertical twist" structure for bit lines in which two bit lines disposed one above the other in planes, for contact-connecting the memory cells, are in each "twisted" downward. However, in the configuration there are regions in which the bit lines are disposed next to one another, which results in an increased horizontal space requirement particularly in the case of cell sizes of less than or equal to $6F^2$.

SUMMARY OF THE INVENTION

It is accordingly an object of the invention to provide a line configuration for bit lines for contact-connecting at least one memory cell, a semiconductor component with a line configuration and a method for fabricating a line configuration, that overcome the above-mentioned disadvantages of the prior art devices and methods of this general type, which are suitable in a space-saving manner for sub-$8F^2$ structures.

With the foregoing and other objects in view there is provided, in accordance with the invention, a bit line configuration for contact-connecting at least one memory cell in a substrate. The bit line configuration contains a first bit line in a first bit line level, and a second bit line in a second bit line level disposed above the first bit line. The second bit line penetrates through the first bit line at at least one penetration location of the first bit line for producing a contact with the at least one memory cell through the penetration location. The first bit line and the second bit line are disposed above of plane of the substrate.

By virtue of the fact that a first bit line in a first bit line level is disposed below a second bit line in a second bit line level and the second bit line penetrates through the first bit line at at least one location for the purpose of producing a contact with the at least one memory cell at least in the horizontal extent partly at penetration locations, the bit lines can entirely or partly cover one another. A horizontal space saving is thus achieved.

It is particularly advantageous if the first bit line and the second bit line are disposed completely one above the other, since then the greatest amount of space is saved.

It is also advantageous if the penetration location is completely enclosed by the first bit line in the horizontal extent, since this prevents lateral overhanging of a through-plating.

In an advantageous refinement of the invention, each memory cell of a column is contact-connected by the first bit line or the second bit line.

It is also advantageous if the memory cells of a column are alternately contact-connected by the first bit line and by the second bit line.

Memory cells are advantageously made smaller than $8F^2$, in particular smaller than $6F^2$, which, in conjunction with the line configuration according to the invention, enables a particularly space-saving configuration of semiconductor components.

In the case of a semiconductor component, in particular a DRAM chip, with a line configuration according to the invention, significantly more memory cells can be disposed than is possible in the case of other architectures. Moreover, as a result of the configuration of the bit line level in a vertical manner, the production tolerances (e.g. in lithography) can be made smaller than in the case of a horizontal configuration. This lowers the production costs.

With the foregoing and other objects in view there is provided, in accordance with the invention, a method for fabricating a bit line configuration. The method includes providing a substrate having a first layer disposed thereon, the first layer having a first trench formed therein. A recess is formed proceeding from the first trench in the first layer, the recess defining a first bit line level. The recess and the first trench are filled with a filling made of a metal. The metal is etched anisotropically, such that only the metal in the recess remains forming a passing bit line and the etching defining a second trench having a bottom. The second trench is filled with a second layer made of a dielectric material, the second layer extends above the second trench and defines a second bit line level. Part of the dielectric material is removed by anisotropic etching resulting in a third trench. A dielectric layer is applied to inner walls defining the third trench. The dielectric layer at a bottom of the third trench is removed. The third trench is filled with an additional metal so that a through-plating from the second bit line level to a memory cell located below the first bit line level is present at a penetration location.

Other features which are considered as characteristic for the invention are set forth in the appended claims.

Although the invention is illustrated and described herein as embodied in a line configuration for bit lines for contact-connecting at least one memory cell, a semiconductor component with a line configuration and a method for fabricating a line configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE PREFERRED EMBODIMENTS

Figure 1A:
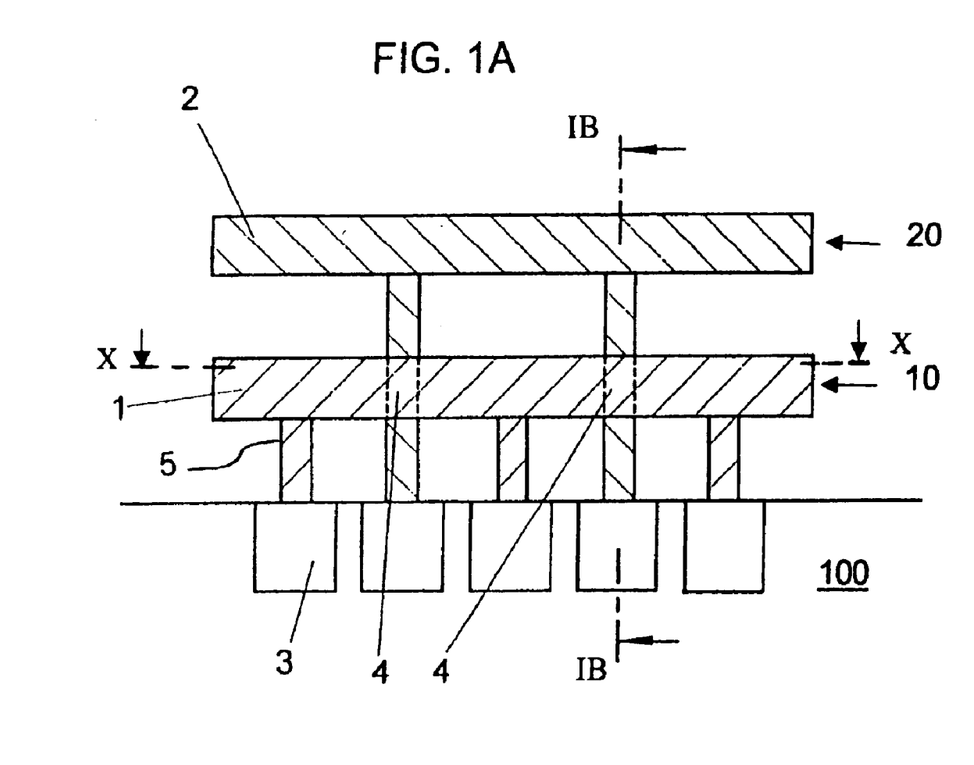
FIG. 1A is a diagrammatic, side view of two bit lines according to the invention.
Figure 1B:
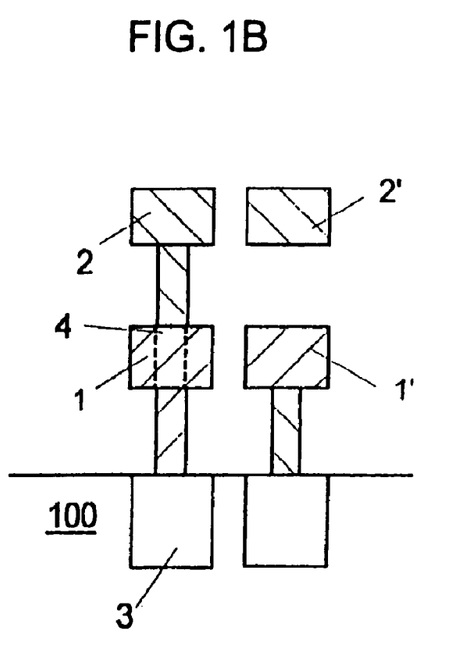
FIG. 1B is a diagrammatic, sectional view of the two bit lines.

Referring now to the figures of the drawing in detail and first, particularly, to FIGS. 1A and 1B thereof, there is shown diagrammatically a first bit line level 10 and a second bit line level 20 lying above it.

FIG. 1A shows a side view in which a first bit line 1 is disposed in the first bit line level 10 and a second bit line 2 is disposed in the second bit line level 20.

Memory cells 3 of a DRAM chip are disposed in a substrate 100. A surface of the substrate 100 is used below as a reference area for the geometrical configuration of a line configuration in a vertical direction.

The memory cells 3 are alternately contact-connected by the first bit line 1 or by the second bit line 2, the second bit line 2 breaking through the first bit line 1 at diagrammatically illustrated penetration locations 4.

Contact connections 5 of the first bit line level 10 to the memory cells 3 are likewise illustrated. The penetration locations 4 are illustrated here by broken lines. The penetration locations 4 are disposed here in such a way that they are completely surrounded by the first bit line 1. As an alternative, it is also possible for the through-plating at the penetration location 4 not to be completely enclosed by the first bit line 1. A partial penetration in the horizontal extent would then be present. Such lateral yielding of the penetration location 4 could also be caused e.g. by small production deviations. Nevertheless, a space-saving configuration is present in the case of such a partial penetration as well.

The sectional view of FIG. 1B taken along the line IB—IB of FIG. 1A illustrates reference bit lines 1', 2' with respect to the first and second bit lines 1, 2. In this case, an activated memory cell 3 is always contact-connected by an active bit line (here e.g. the first bit line 1 or the second bit line 2), the corresponding parallel reference bit line 1', 2' respectively not being contact-connected to the activated memory cell 3.

A distance between the contact connections of the memory cells that is as short as possible also improves the signal-to-noise ratio. In the above-cited work by Hoenigschmid et al., it was found that the number of twists correlates positively with the signal-to-noise ratio. In the case of the present configuration, a twist, i.e. a penetration, takes place practically at each memory cell 3, so that the signal-to-noise ratio seeks the best possible solution.

The bit lines 1', 2' lying horizontally on a plane with the bit lines 1, 2 are used here as reference bit lines 1', 2'. As an alternative, it is also possible to choose the reference bit lines 1', 2' in the vertical direction.

An embodiment of a method according to the invention that can be used to fabricate the above-described line structure for bit lines is described with reference to FIGS. 2A to 9B below. In this case, different materials are indicated by different hatching.

The assignment of the sectional views to the plan view is explained upon each first occurrence, so that a description of the assignment can be omitted or shortened in order to avoid long drawn-out passages in the case of subsequent figures that are disposed analogously.

In this case, FIGS. 2A to 9B each show the state after a group of method steps, the DRAM structure on which the bit line structure is applied being omitted in the sectional views for reasons of clarity.

FIGS. 2A–2D illustrate the state after a first group of method steps have been performed. The individual method steps, e.g. etching, photolithography, CMP, are known, in principle, so that they will not be discussed in any greater detail here.

Figure 2A:
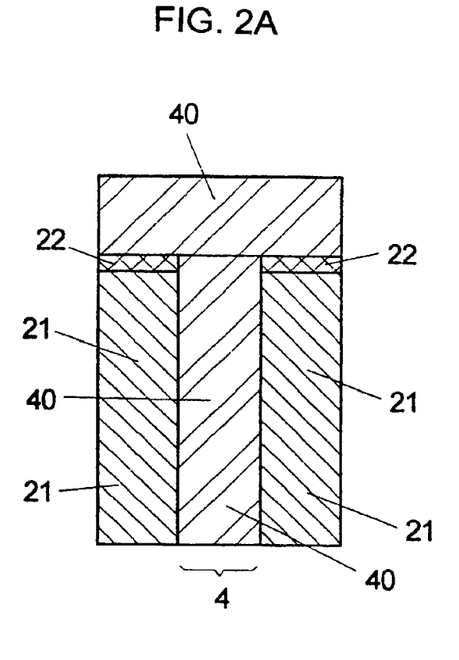
FIGS. 2A and 2B are sectional views of the two bit lines after performing first method steps of a method according to the invention.
Figure 2B:
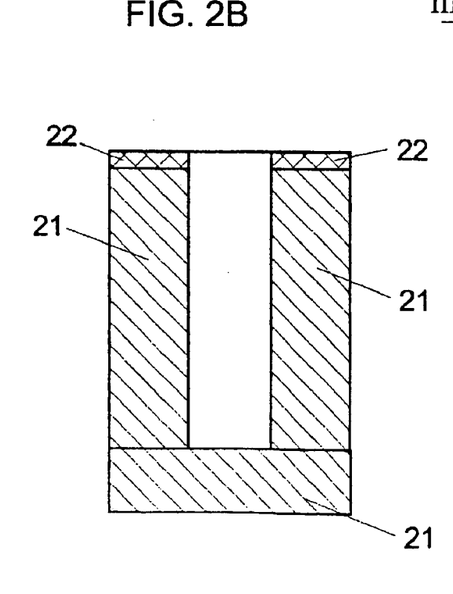
Figure 2C:
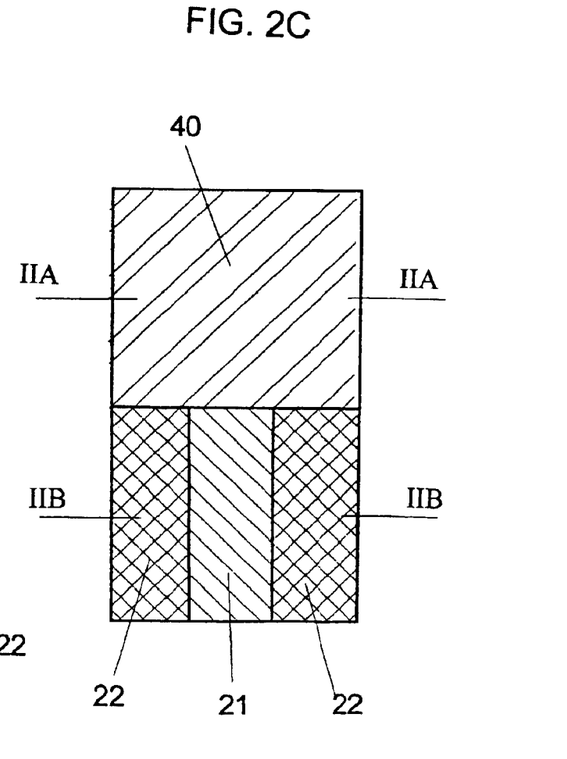
FIGS. 2C and 2D are plan views of the two bit lines after performing the first method steps of the method according to the invention.

The sectional views of FIGS. 2A and 2B are taken along the section lines IIA—IIA and IIB—IIB, respectively, of FIG. 2C. The different hatchings specify the materials used.

As can be seen in FIG. 2A and FIG. 2B, first a first dielectric 21 (here $SiO_2$) is deposited to a sufficient thickness. The material is intended, inter alia, to take up the penetration location 4 to a non-illustrated source/drain region of the DRAM memory cell 3 and the bit lines 1 of the first bit line level 10.

A layer of a second dielectric 22 (here Si$_3$N$_4$) is deposited on the layer of the first dielectric 21. What is essential in this case is that the first dielectric 21 and the second dielectric 22 can be etched selectively. The second dielectric 22 is patterned by applying a resist layer that is patterned photolithographically. This structure is then transferred to the first dielectric 21 and the second dielectric 22 by a dry etching process.

In the present case, after the application of the two dielectrics 21, 22, a wet etching is performed, thereby producing a trench for the later configuration of the contact connection 5 of the first bit line level 10. Photoresist 40 is then applied in the trench and to the surface. The structure then present is illustrated in FIG. 2A.

In a part of the line configuration which lies beside the sectional view of FIG. 2A, i.e. in FIG. 2B, the trench is not etched through as far as the source/drain region, so that the first dielectric 21 is present at the bottom of the trench. The penetration location 4 of the second bit line level 20 through the first bit line level 10 is later disposed at this location.

FIG. 2C illustrates a plan view. An upper part of FIG. 2C illustrates the region which is illustrated in section in FIG. 2A. The entire surface is covered here with the photoresist 40.

The lower part illustrates the region that is illustrated in section in FIG. 2B, namely the trench in the first dielectric 21, the upper areas being covered with the second dielectric 22.

Figure 2D:
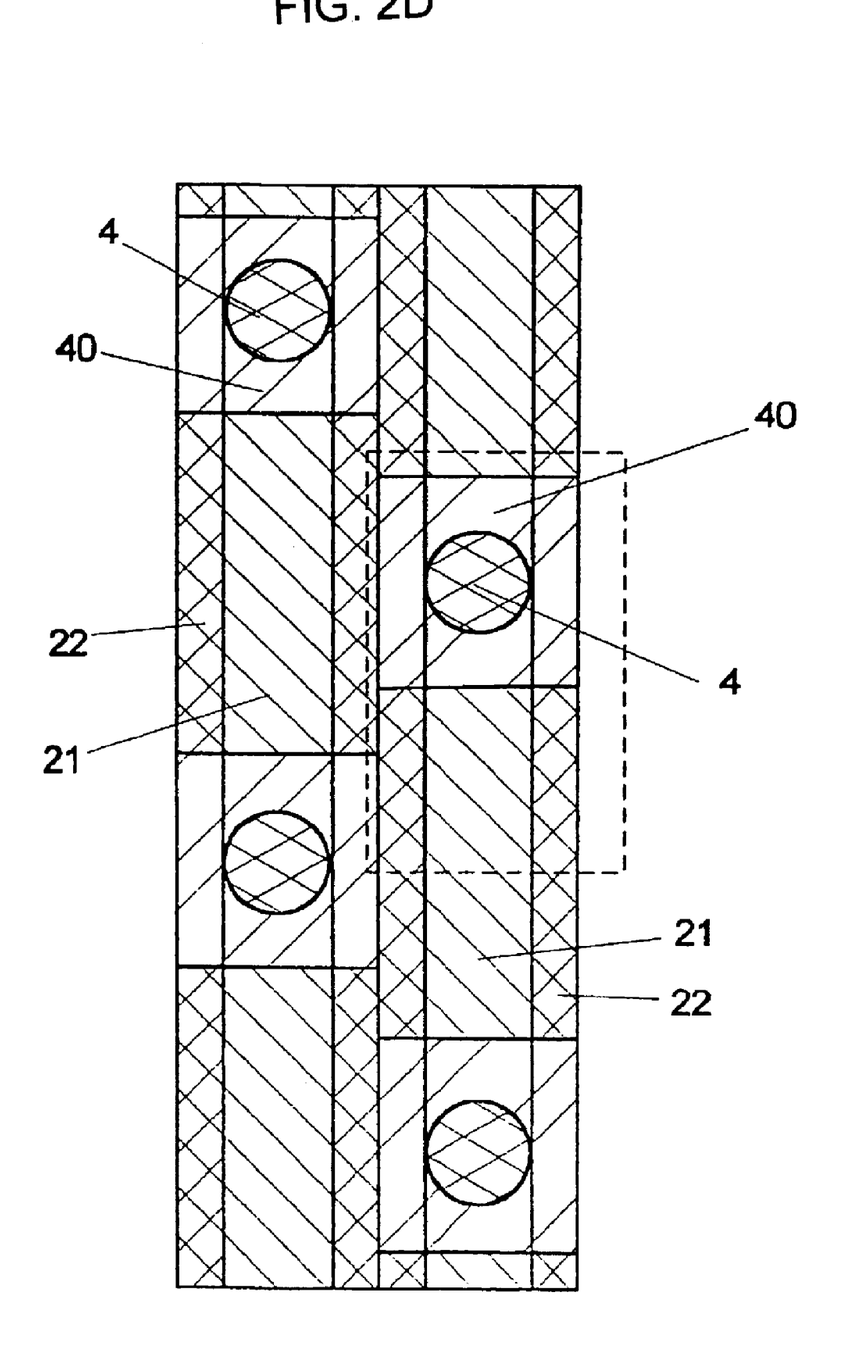

FIG. 2D illustrates the two bit lines 1, 2 in a plan view. Approximately the region illustrated in the plan view in FIG. 2C is selected by the zone depicted by broken lines. The assignment of the two sectional views of FIGS. 2A and 2B is indicated laterally. The region of FIG. 2A illustrates the region in which the contact connection 5 of the first bit line level 10 to the substrate is later located. The region of FIG. 2B will later have an extended trench (see FIG. 10) for taking up the penetration location 4 of the second bit line level 20 through the first bit line level 10. Since the elements in FIG. 2D are repeated, they are not all provided with reference symbols, for reasons of clarity.

Figure 3A:
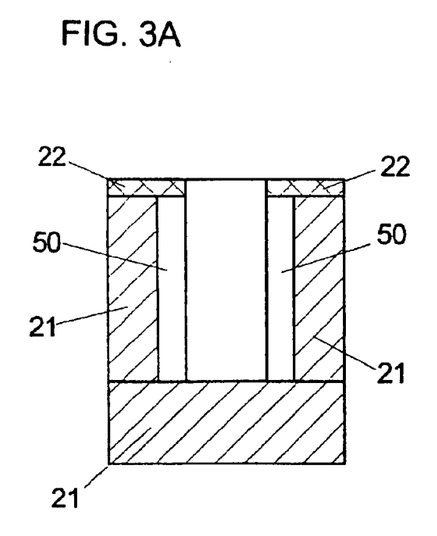
FIG. 3A is a sectional view of the bit line after performing second method steps of the method.
Figure 3B:
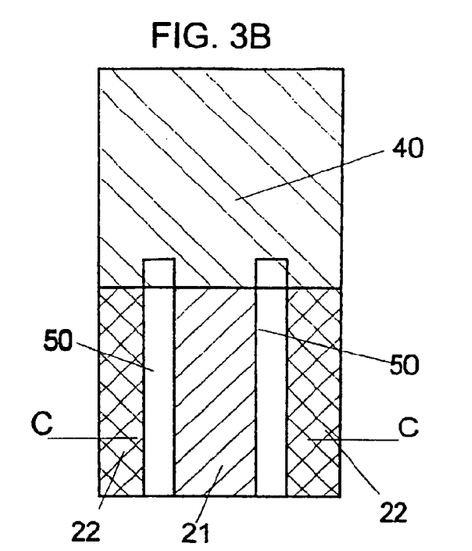
FIG. 3B is a plan view of the bit line after completion of the second method steps of the method.

FIG. 3A illustrates a sectional view taken along the line IIIA—IIIA shown in FIG. 3B, after a performance of second method steps. The sectional view of FIG. 3A thus shows the lower part of the plan view according to FIG. 3B. The upper part of the plan view is covered with the photoresist 40 in a manner unchanged from FIG. 2C.

Accordingly, the following method steps are performed only in the lower part of the detail illustrated in FIG. 3B.

The sectional view of FIG. 3A reveals that a recess 50 is introduced into the first dielectric 21 below the layer of the second dielectric 22.

The recess 50 is later intended to take up the passing or first bit line 1 of the first bit line level 10.

In the plan view of FIG. 3B, the recess 50 is indicated below the second dielectric 22 and partly below the photoresist 40.

Figure 4A:
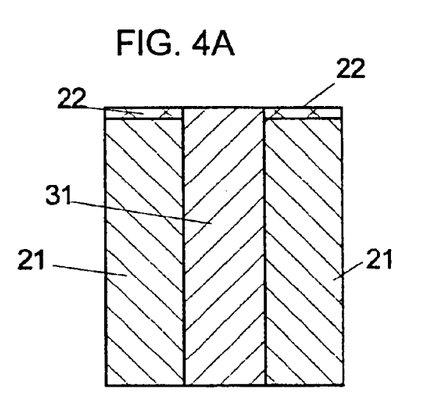
FIGS. 4A and 4B are sectional views of the bit line after the completion of third method steps of the method.
Figure 4B:
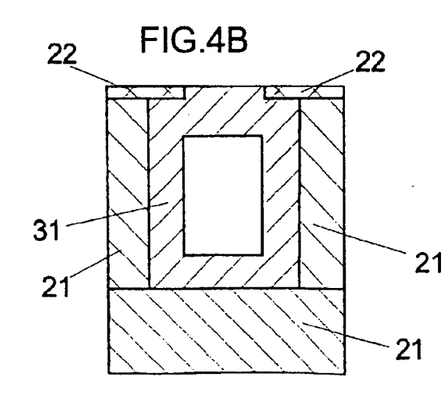
Figure 4C:
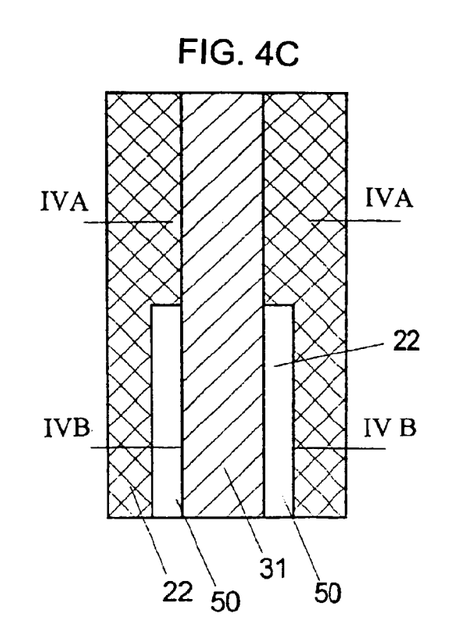
FIG. 4C is a plan view of the bit line after completion of the third method steps of the method.

FIGS. 4A and 4B illustrate two sectional views associated with the plan view in FIG. 4C. This shows the situation after third method steps are performed.

The assignment of the figures is specified analogously to FIGS. 2A–2B by the section lines IVA—IVA and IVB—IVB.

As part of the third method steps, the photoresist 40 is removed, the resulting spaces being filled with a first metal 31 by conformal deposition (e.g. by chemical vapor deposition (CVD)). By way of example, doped polycrystalline silicon or tungsten may serve as the first metal 31.

In this case, a lining with the first metal 31 with an inclusion of a cavity is achieved in the region of the recess 50 that is illustrated in FIG. 4B. In the plan view of FIG. 4C, the recess 50 is indicated by lines below the layer made of the second dielectric 22.

The first metal 31 is then removed by a chemical mechanical polishing (CMP) step or an etching step, the second dielectric 22 serving as a stop layer. This completes the fabrication of the first bit line level 10.

Figure 5A:
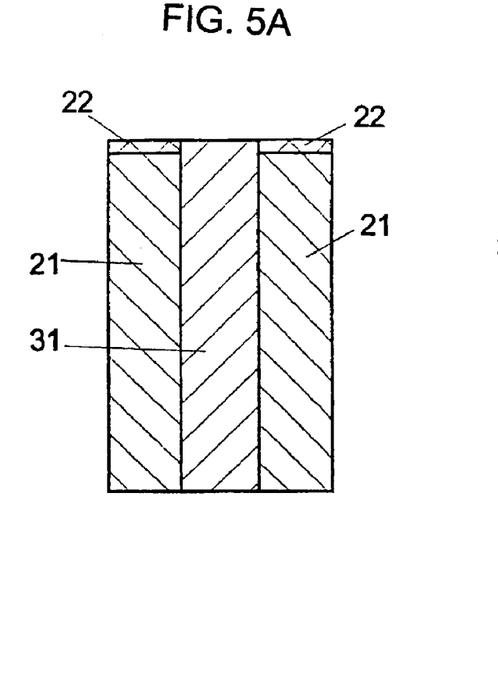
FIGS. 5A–5C are sectional views of the bit line after the completion of fourth method steps of the method.
Figure 5B:
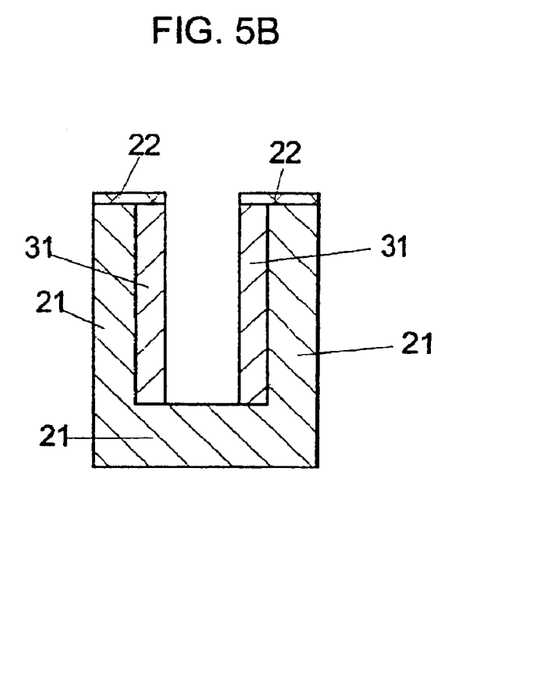
Figure 5C:
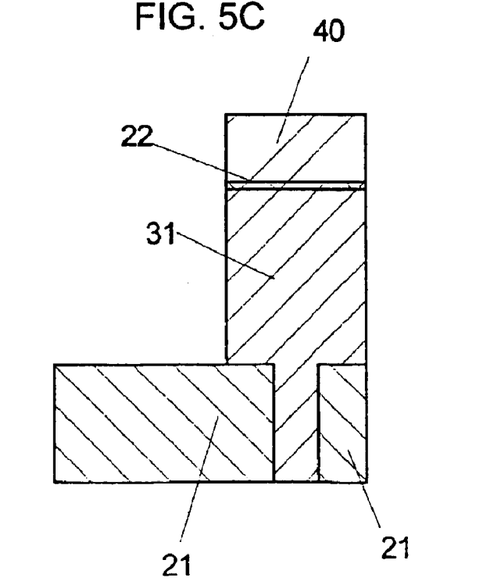
Figure 5D:
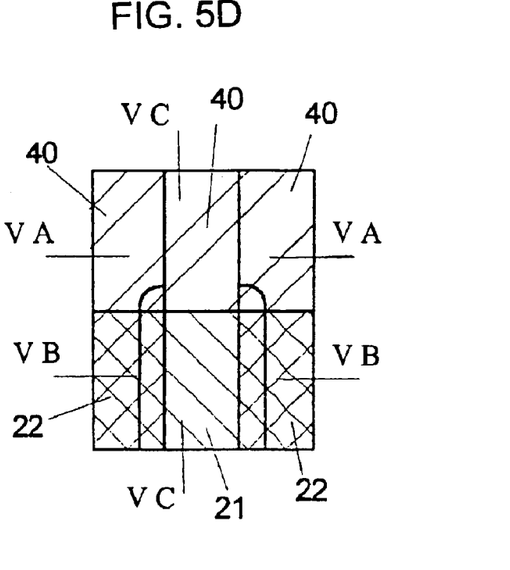
FIG. 5D is a plan view of the bit line after the completion of the fourth method steps of the method.

FIGS. 5A and 5B again show two sectional views which, analogously to FIGS. 2A, 2B, 4A and 4B, are assigned to the sections VA—VA and VB—VB, respectively, in FIG. 5D. Furthermore, FIG. 5C illustrates a sectional view along the line VC—VC shown in FIG. 5D.

That part of the structure that is illustrated in FIG. 5A is unchanged from the previous method steps (FIG. 4A). That part of the structure that is illustrated in FIG. 5B is patterned further by fourth method steps.

Through anisotropic etching of the first metal 31 (see FIG. 5B), the topmost metal layer and the bottommost metal layer are opened here, so that a free passage for the through-plating is produced here.

FIGS. 6A–6C and 6D, which show the situation after the fifth method steps are performed, are configured analogously to FIGS. 5A–5C and 5D, respectively.

Figure 6A:
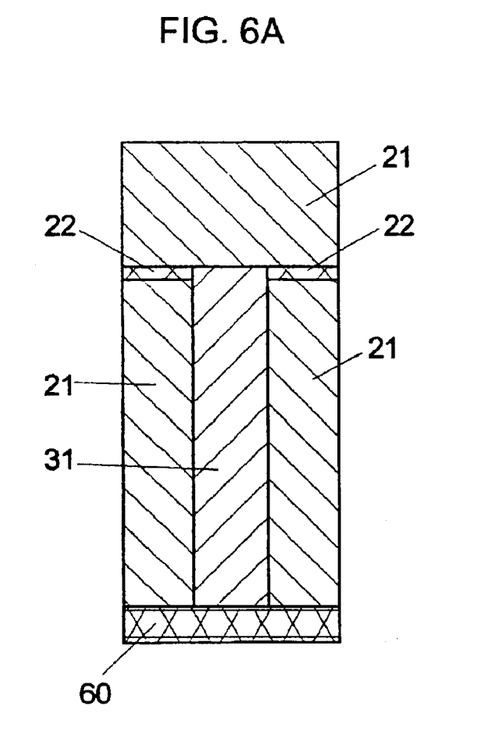
FIGS. 6A–6C are sectional views of the bit line after the completion of fifth method steps of the method.
Figure 6B:
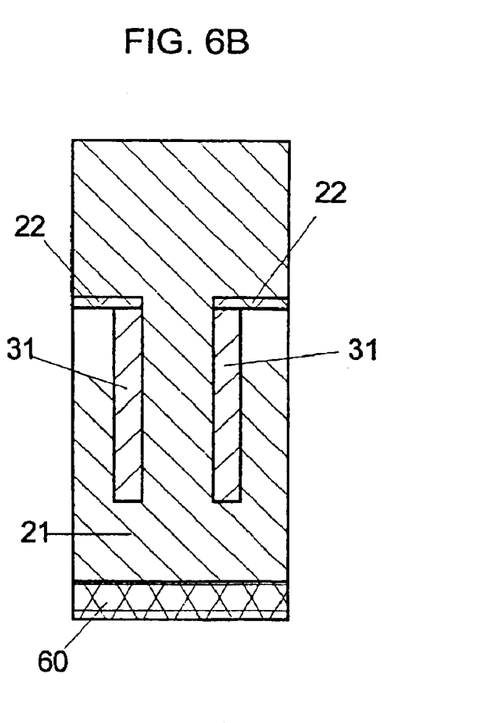
Figure 6C:
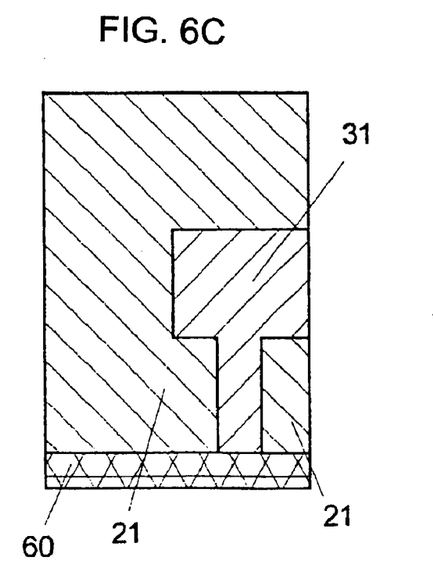
Figure 6D:
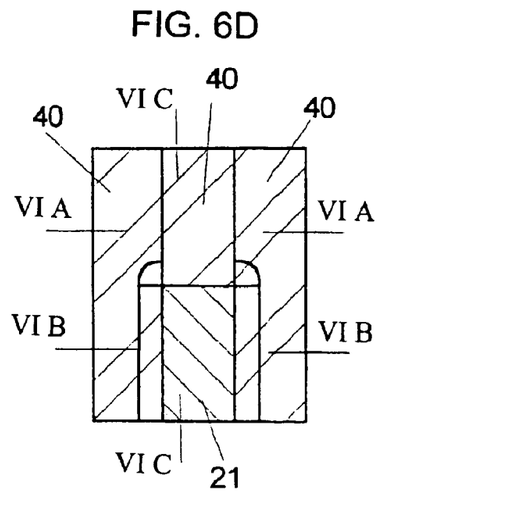
FIG. 6D is a plan view of the bit line after the completion of the fifth method steps of the method.

Proceeding from the situation in FIGS. 5A–5D, first the photoresist 40 is removed and a dielectric, here the first dielectric 21 (SiO$_2$), is deposited. The trench illustrated in FIG. 6B is thus filled. The deposited layer must be thick enough toward the top to be able to take up the second bit line level 20. Since it is important for the subsequent method steps, a source/drain region 60 that was previously omitted for reasons of clarity is illustrated here.

The individual illustrations of FIGS. 7A-7D, which show the situation after the sixth method steps are performed, are disposed analogously to FIGS. 6A-6D.

Figure 7A:
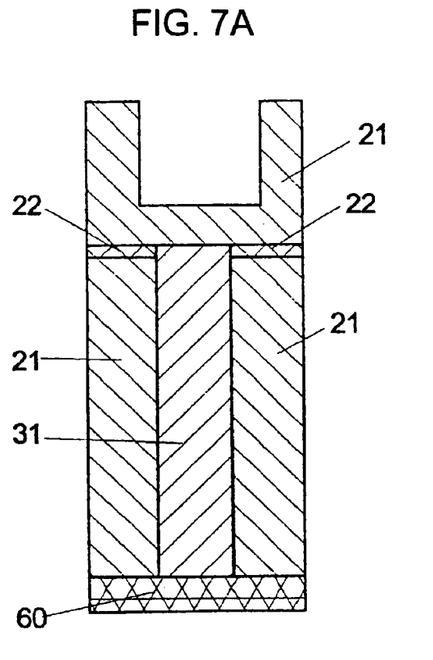
FIGS. 7A–7C are sectional views of the bit line after the completion of sixth method steps of the method.

FIG. 7A shows an anisotropic etching of the first dielectric 21, as a result of which a trench which does not reach as far as the first metal 31 is produced in the upper region of the line configuration.

Figure 7B:
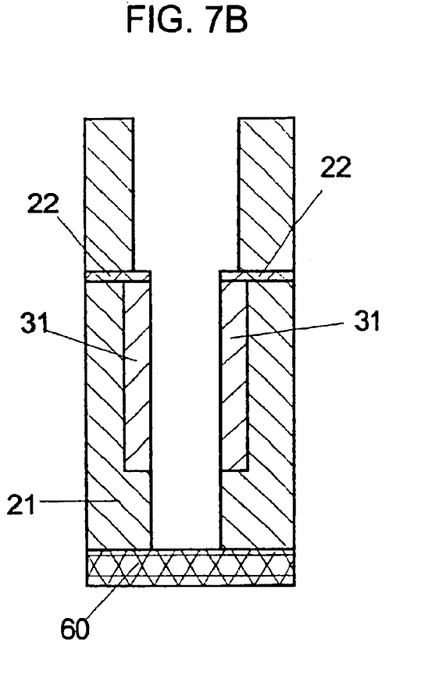
Figure 7C:
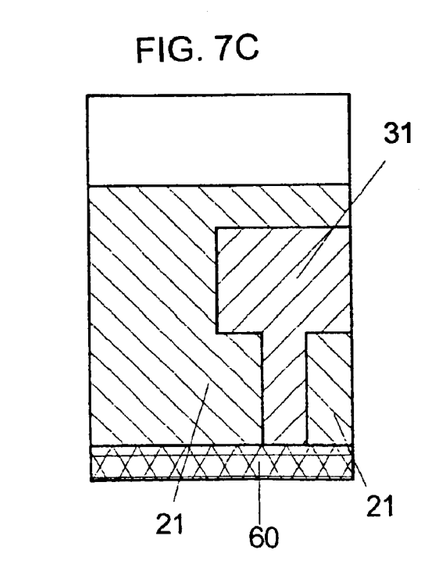
Figure 7D:
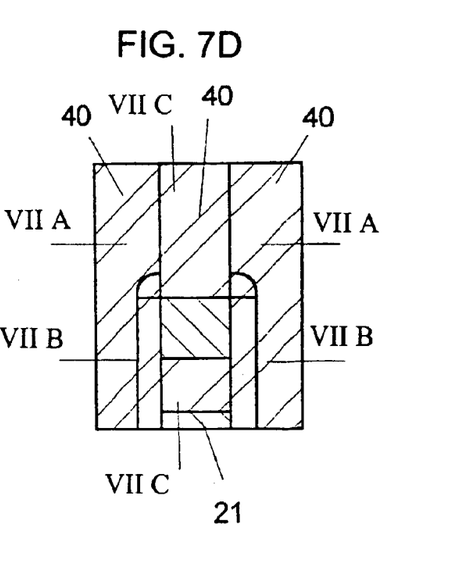
FIG. 7D is a plan view of the bit line after the completion of the sixth method steps of the method.

For the through-plating, the hole is etched through completely as far as the source/drain region 60 in the other part of the line configuration (see FIG. 7B). A hole and trench of the second bit line level are usually produced in separate lithography and etching processes.

The individual illustrations of FIGS. 8A–8D, which show the situation after the seventh method steps are performed, are disposed analogously to the illustrations in FIGS. 7A–7D.

Figure 8A:
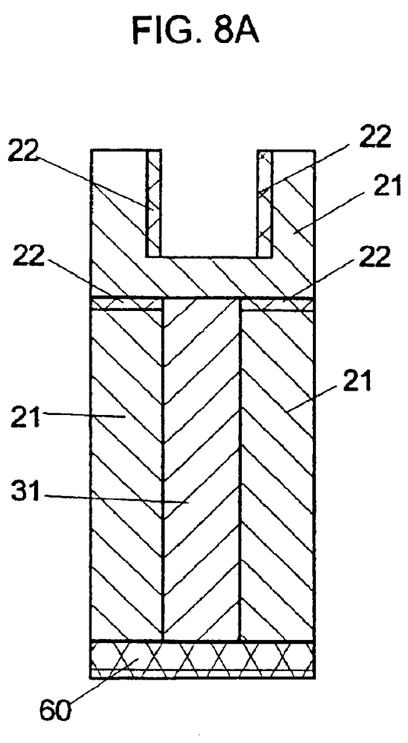
FIGS. 8A–8C are sectional views of the bit line after the completion of the seventh method steps of the method.
Figure 8B:
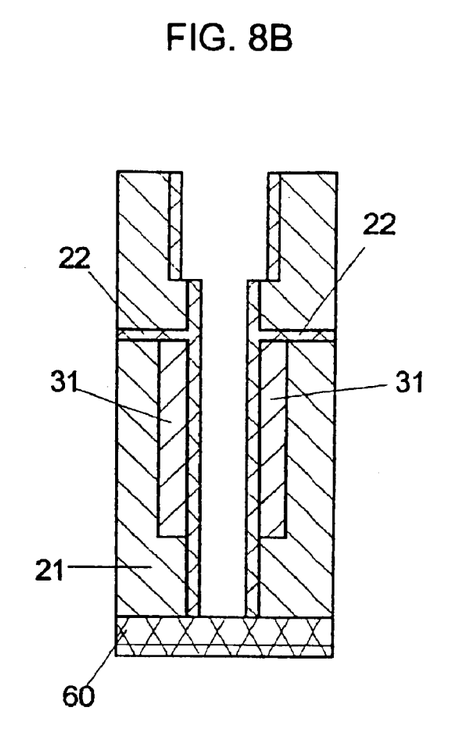
Figure 8C:
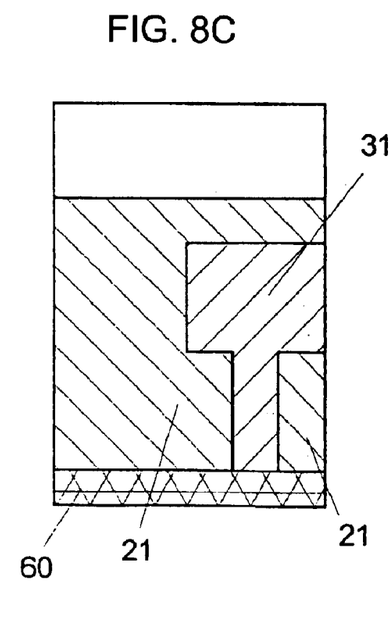
Figure 8D:
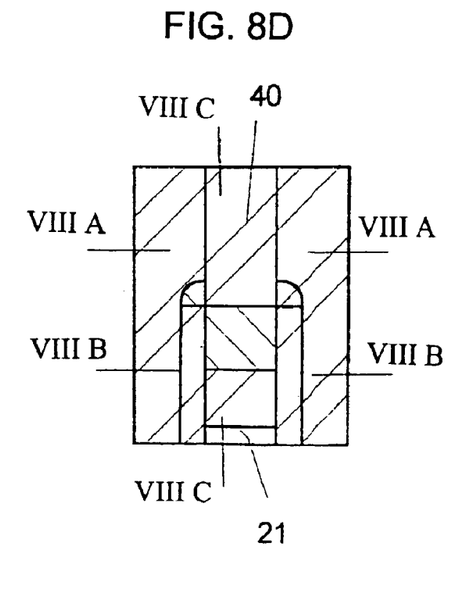
FIG. 8D is a plan view of the bit line after the completion of the seventh method steps of the method.

The spaces produced by the etching are lined with the second dielectric 22 (Si$_3$N$_4$) by deposition and are subsequently etched anisotropically, so that the dielectric layer is removed at the bottom of the lined spaces. FIG. 8B thus illustrates a contact hole which is laterally lined with dielectric material.

Afterward, the resulting spaces are filled with first metal 31 and polished (e.g. damascene process flow). A through-contact as far as the source/drain region 60 of a memory cell 3 is thus present.

Figure 9A:
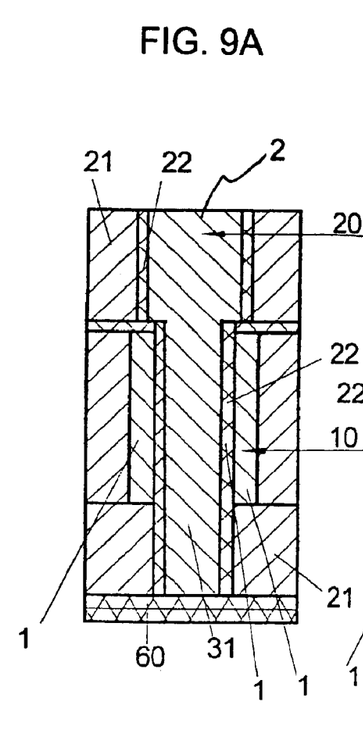
FIG. 9A is a sectional views of the bit line.
Figure 9B:
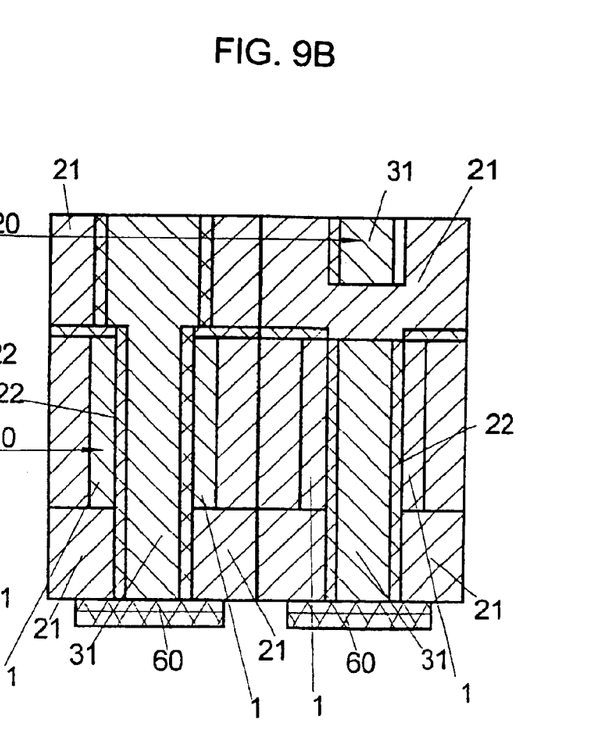
FIG. 9B is a sectional view of the two bit lines disposed next to one another.

This is illustrated in FIG. 9A in a sectional view of a complete structure of the line configuration. FIG. 9B illustrates two structures lying next to one another (FIGS. 1A–1B).

The assigned regions of the first bit line level 10 and of the second bit line level 20 are illustrated by arrows.

In the first bit line level 10, the through-contact is surrounded by the first or passing bit line 1 in the region of the penetration location 4. The two bit lines 1, 2 are isolated from one another by the dielectric layers 22, so that the upper second bit line 2 can penetrate through the underlying first bit line 1 (see FIG. 1A).

FIGS. 9A–9B also reveal how the lower, the first or passing bit line 1 is penetrated by the upper second bit line 2. Since the two bit lines 1, 2 lie precisely one above the other, a high lateral space saving is achieved. The reference bit lines 1', 2' can be disposed relatively near to them.

Figure 10:
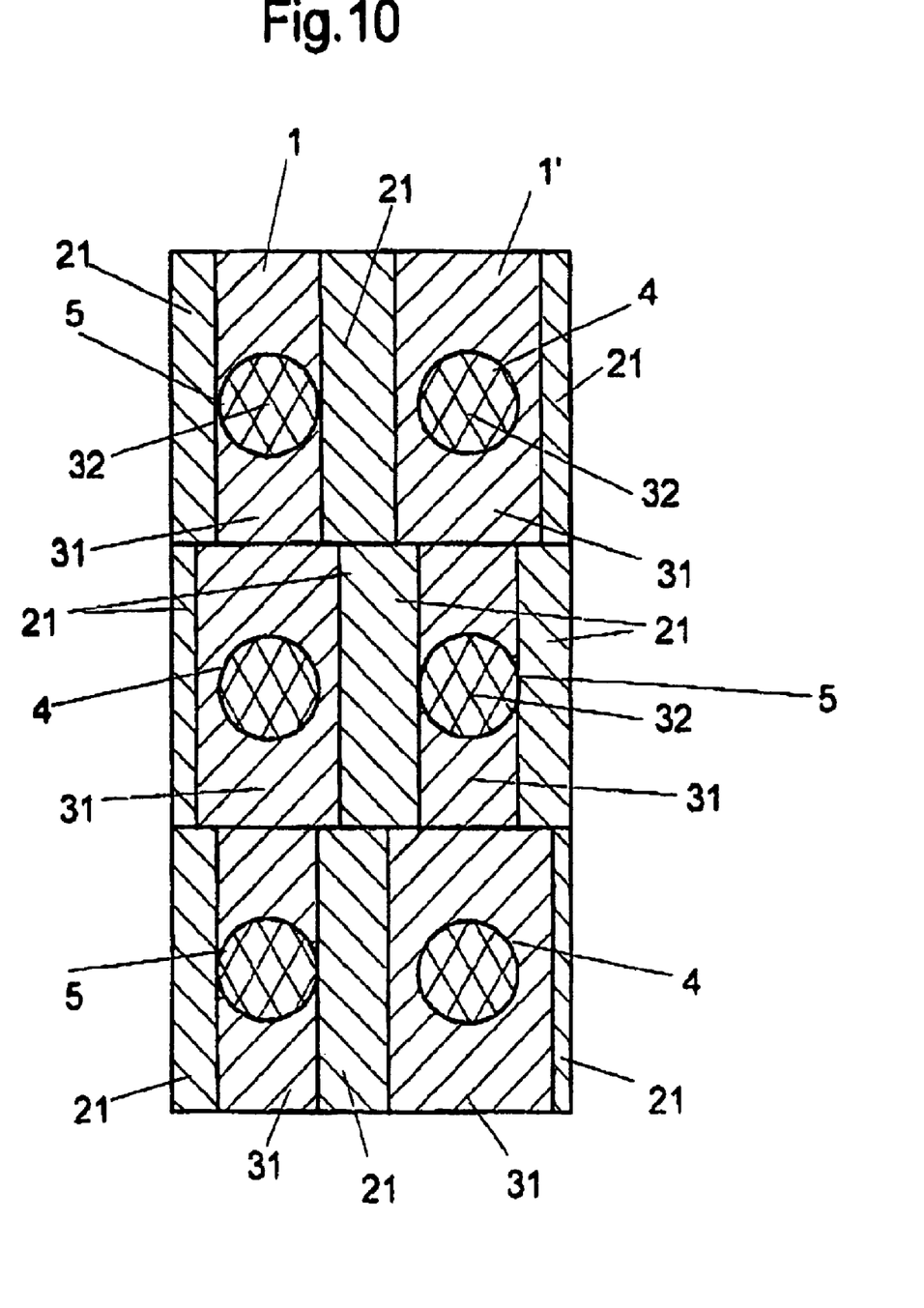
FIG. 10 is a horizontal sectional view taken along line X—X shown in FIG. 1A showing the two parallel bit lines in detail.

FIG. 10 illustrates a horizontal sectional view through the first bit line level 10 taken along the line X—X shown in FIG. 1A. Two parallel bit lines 1, 1' are illustrated. Laterally, the bit lines 1 are each bounded by the first dielectric material 21 (here SiO$_2$).

The left-hand bit line 1 has, in the center, a trench with an extended cross section in which the passing or first bit line 1 is disposed with the penetration location 4. Analogous regions can be found at the top and bottom in the right-hand bit line 1'.

In the left-hand bit line 1, a trench is disposed at the top, in which the contact connection 5 of the first bit line level 10 to the substrate 100 is shown (although not actually visible in the section, illustrated here as a second metal 32). Analogous regions can be found at the bottom in the left-hand bit line 1 and in the center in the right-hand bit line 1'. For simplification, FIG. 10 does not illustrate the insulation with the dielectric liners in the region of the penetration location 4.

The embodiment of the invention is not restricted to the preferred exemplary embodiments specified above. Rather, a number of variants are conceivable which make use of the line configuration according to the invention, the semiconductor component according to the invention and the method according to the invention in embodiments of fundamentally different configuration as well.

We claim:

1. A bit line configuration for contact-connecting at least one memory cell in a substrate, the bit line configuration comprising:
    a first bit line in a first bit line level; and
    a second bit line in a second bit line level disposed above said first bit line, said second bit line penetrating through said first bit line at at least one penetration location of said first bit line for producing a contact with the at least one memory cell through said penetration location, said first bit line and said second bit line disposed above of plane of the substrate.

2. The bit line configuration according to claim 1, wherein said first bit line and said second bit line are disposed completely one above another.

3. The bit line configuration according to claim 1, wherein said penetration location is completely enclosed by said first bit line in a horizontal extent.

4. The bit line configuration according to claim 1, wherein the at least one memory cell is one of a plurality of memory cells, and each memory cell of a column of memory cells is contact-connected by one of said first bit line and said second bit line.

5. The bit line configuration according to claim 1, wherein the at least one memory cell is one of a plurality of memory cells, and the memory cells of a column of the memory cells are alternately contact-connected by said first bit line and by said second bit line.

6. The bit line configuration according to claim 5, wherein the memory cells are made smaller than 8F$^2$ and are dynamic random access memory cells.

7. The bit line configuration according to claim 5, wherein the memory cells are made smaller than 6F$^2$.

8. A semiconductor component, comprising:
    a bit line configuration for contact-connecting at least one memory cell in a substrate, the bit line configuration containing:
        a first bit line in a first bit line level; and
        a second bit line in a second bit line level disposed above said first bit line, said second bit line penetrating through said first bit line at at least one penetration location of said first bit line for producing a contact with the at least one memory cell through said penetration location, said first bit line and said second bit line disposed above a plane of the substrate.

9. The semiconductor component according to claim 8, wherein the semiconductor component is a DRAM chip.

* * * * *